United States Patent [19]

Thom

[11] 4,039,833
[45] Aug. 2, 1977

[54] HIGH DENSITY INFRARED DETECTOR ARRAY

[75] Inventor: Richard D. Thom, Santa Barbara, Calif.

[73] Assignee: The United States of America as represented by the Secretary of the Navy, Washington, D.C.

[21] Appl. No.: 715,038

[22] Filed: Aug. 17, 1976

[51] Int. Cl.² .................... G01J 1/00; H01L 27/14
[52] U.S. Cl. ............................. 250/332; 250/330; 250/370
[58] Field of Search ............ 250/330, 332, 334, 370

[56] References Cited

U.S. PATENT DOCUMENTS

| | | | |
|---|---|---|---|
| 2,951,175 | 8/1960 | Null | 250/332 X |
| 3,919,555 | 11/1975 | Singer | 250/332 |
| 3,963,926 | 6/1976 | Borrello | 250/332 X |
| 3,979,604 | 9/1976 | Bate | 250/370 X |
| 4,000,502 | 12/1976 | Butler et al. | 250/370 X |

Primary Examiner—Archie R. Borchelt
Attorney, Agent, or Firm—R. S. Sciascia; Henry Hansen; William J. Iseman

[57] ABSTRACT

A high density infrared detector array is stacked with and bonded to a complementing silicon microcircuit chip by interconnecting solder bumps. The silicon chip is provided with a plurality of window areas, each of said areas positioned in registration with a corresponding underlying detector element for permitting the transmission of infrared radiation to the array.

10 Claims, 4 Drawing Figures

HIGH DENSITY INFRARED DETECTOR ARRAY

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to infrared (IR) detector arrays and particularly to such an array having a high density and which is stacked with and bonded to a complementing silicon microcircuit chip which is provided with window areas to permit the transmission of infrared energy to the underlying array.

Infrared detector arrays find wide application in the aerial use of scanning devices such as forward looking infrared (FLIR) apparatus. Coupled with an appropriate optical system ahead of the array and mounted in an aircraft, the IR array is caused to scan an area underneath and ahead of the aircraft in such a manner as to detect infrared radiation emanating from an area of interest and to form a composite infrared radiation sensitive image of the area being scanned. Because of the relatively high amount of interconnect wiring and signal processing needed to extract information from IR detector elements within the array, IR arrays have been constrained, for example, to a linear, single dimensional form with spacing to the side of the linear arrays being largely utilized for interconnect wiring and associated circuitry. Attempts to parallel such linear arrays with other arrays of similar configuration present relatively large gaps between the paralleled arrays because of the aforementioned interconnect wiring and associated circuitry. Because of the relatively large gaps between the paralleled line arrays, the image of the target being scanned exhibits either a relatively low degree of sensitivity and resolution or dead spots associated with the spacings in the arrays.

SUMMARY OF THE INVENTION

Accordingly, it is an object of the present invention to provide a high density, two dimensional, mosaic infrared detector array having a minimal amount of spacing between the detector elements therein. Another object of the invention is to stack and bond an infrared detector array to a complementing silicon microcircuit chip by interconnecting solder bumps for transferring a substantial portion of detector array interconnect wiring and associated circuitry to the chip. Yet another object of the invention is to provide the complementing silicon chip with a plurality of window areas, each of said areas being positioned in registration with a corresponding underlying detecting element, for permitting the transmission of infrared radiation to the array. A further object of the present invention is to provide a high density infrared radiation information processing device which is capable of generating a relatively highly resolved and sensitive infrared image.

Briefly, these and other objects are accomplished by a high density infrared detector array having minimal spacings between the respective elements thereof and which array is stacked with and bonded to a complementing silicon microcircuit chip by interconnecting solder bumps. The silicon chip is provided with a plurality of window areas, each of said areas being positioned in registration with a corresponding underlying element for permitting the transmission of infrared radiation to the array. The solder bumps provide a third dimension interconnect between the stacked detector array and microcircuit chip and transfer a substantial portion of interconnect wiring and associated circuitry away from the immediate area of the detector elements and onto the complementing chip thereby allowing the IR detector elements to be grouped very closely together and to minimize spacings therebetween.

For a better understanding of these and other aspects of the invention, reference may be made to the following detailed description taken in conjunction with the accompanying drawings.

DESCRIPTION OF THE PREFERRED EMBODIMENT

Figure 1:
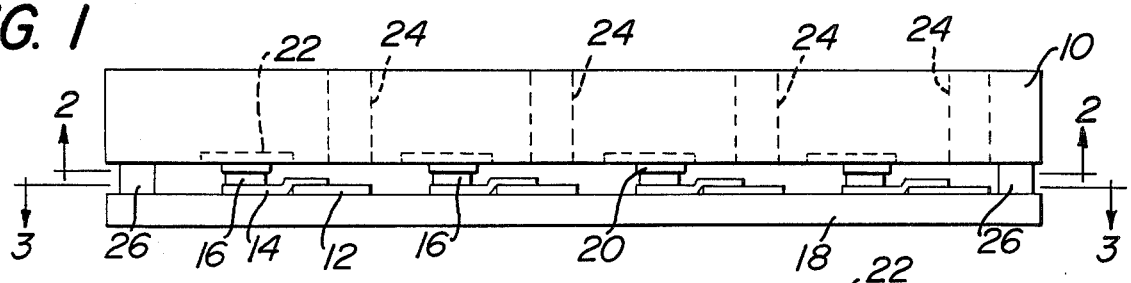
FIG. 1 is a side elevation view of an infrared detector array interconnected to a complementing microcircuit chip according to the present invention.

Referring now to FIG. 1, there is shown a side elevation view of an infrared transparent circuit chip 10 being stacked upon and bonded to a plurality of infrared detector elements 12. Each of the IR detector elements 12 are connected by means of a circuit lead 14 to a corresponding bonded terminal 16 which is utilized to interconnect circuitry on the chip 10 to the respective IR elements 12. Beneath the elements 12 and corresponding circuit leads 14, and commonly connected thereto in a conventional manner such as by evaporative deposition, is a substrate 18 forming part of the IR detector array which is comprised of, for example, indium antimonide. Connected on the chip side of the bonded terminals 16 are corresponding circuit pads 20 which are further connected with associated active circuit devices 22 formed on and within the chip 10. The chip 10 is also provided with a plurality of window areas 24 which, although forming a part of the chip 10, are bounded to conform with the sensitive detecting areas of the respective IR detector elements 12 and which are kept free of any obstructions such as interconnecting circuitry or wiring found on other portions of the chip 10 with the result that incoming radiation is directed to the chip 10 and passes therethrough to the respective detector elements 12. The chip may be made of any material transparent to infrared radiation such as silicon in the preferred embodiment, or of similarly characterized substances such as glass or ceramic. Accordingly, the use of a silicon chip in the present embodiment is by way of example only and other microcircuit supportive materials which are transparent to infrared radiation may be substituted therefor. A plurality of dielectric spacers 26 are positioned between the stacked chip 10 and the substrate 18 and about the outer peripheries thereof in order to maintain the spacing between the stacked members and also to add rigidity and an aid in aligning the members during the bonding process.

Figure 2:
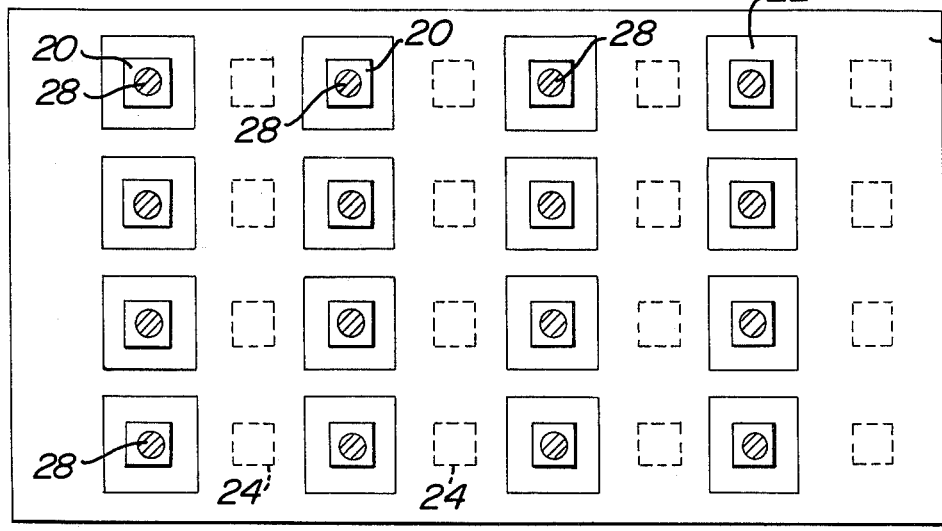
FIG. 2 is a top view in section of the microcircuit chip taken along the lines 2—2 noted in FIG. 1.

Referring now to FIG. 2, there is shown a top view, in section, of the chip 10 shown in FIG. 1 and as viewed along the lines 2—2 noted therein. More clearly shown are the window areas 24 whose boundaries are defined by the dotted lines. Also more clearly shown are the circuit pads 20, each having a respective solderable terminal 28 near the center thereof. Surrounding the pad 20 and the terminal 28 are the respective active devices 22.

Figure 3:
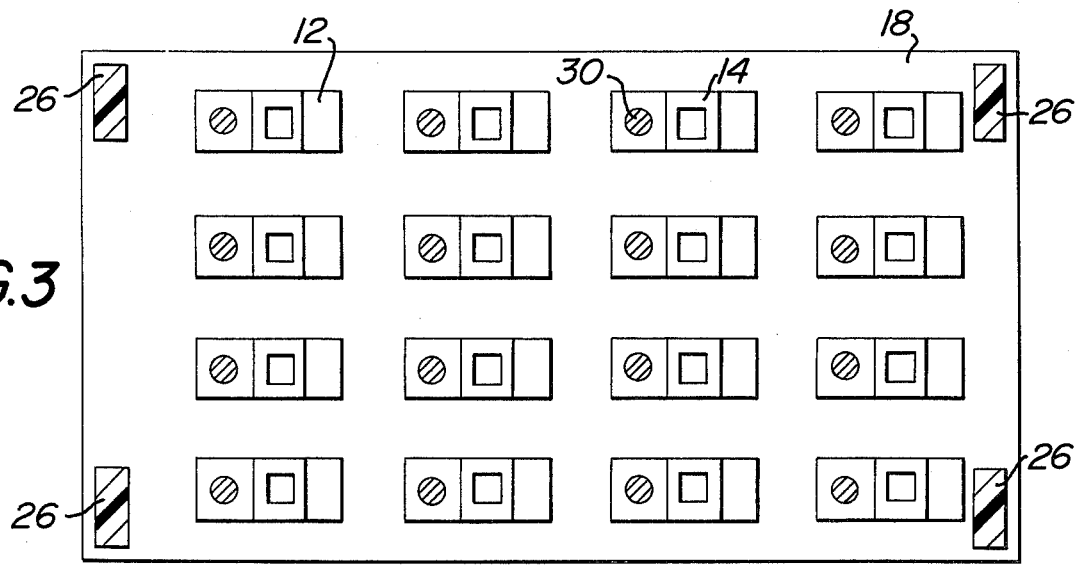
FIG. 3 is a top view in section of the infrared detector array taken along the lines 3—3 noted in FIG. 1.

FIG. 3 illustrates a top view, in section, of the infrared detector substrate 18 shown taken along the lines noted as 3—3 in FIG. 1. More clearly shown is the arrangement of the detector elements 12 which, in this example, form a 4×4 matrix. Each of the detector elements 12 are interconnected by the circuit lead 14 to a solderable terminal 30. Also shown in the four corners of the substrate 18 and attached thereto are the dielectric spacers 26.

Figure 4:
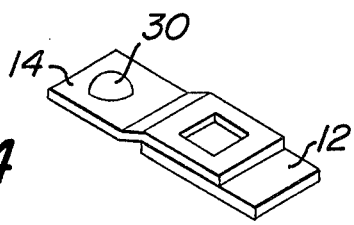
FIG. 4 is a perspective view of one of the infrared detector elements shown in FIGS. 1 and 3.

Referring now to FIG. 4, there is shown a perspective view of one of the detector elements utilized in the array. The detector element 12 preferably comprises indium antimonide material having an open area which is sensitive to infrared radiation. The circuit lead 14 is formed in a stepped configuration to overlap a portion of the detector element 12 and has a rectangular contact area cut in the overlapping portion thereof in order to provide an interconnecting circuit between the lead 14 and the element 12. The means for interconnecting the lead to the detector element may be accomplished in any conventional manner. The contact area cut in the lead is also conventional and is used in cutting through the oxide layer normally found on the IR detector element. The solderable terminal 30 is deposited on the uncut contact area of the lead 14 and is formed of a low melting point solderable material, such as indium, into a bump as shown. The terminals 28 on the chip 10 are preferably also of a bump form and made of indium.

The high density infrared detector array of the present invention is formed by stacking and bonding the microcircuit chip 10 to the infrared detector substrate 18 as shown in FIG. 1. Although shown in FIG. 3 as a 4×4 rectangular matrix, the respective IR detector elements 12 may be closely grouped in any convenient manner and in any quantity and in as small a spacing between one another as the respective physical sizes will permit thereby to maximize the density of detector elements on the substrate. The resultant groupings of the IR elements will thereby form a two dimensional mosaic configuration as opposed to a one dimension linear array. Whatever the configuration of the elements 12 on the substrate 18, however, the microcircuit chip 10 must provide a plurality of mating window areas 24 such that when the chip 10 is stacked upon and aligned with and bonded to the substrate 18, each of the respective window areas 24 are formed in registration with a corresponding one of the sensitive areas of the IR detector elements 12. Additionally, each of the terminals 28 on the chip 10 must be in mating registration with corresponding terminals 30 on the substrate 18. The portions of the chip 10 remaining outside the window area 24 boundaries are used to the fullest extent necessary for the implementation of associated interwiring and active circuitry such as charged coupled devices (CCD) which provide readout functions for the IR detector array. The terminals 28 of the chip 10 and terminals 30 of the substrate 18 are bonded together in any conventional manner, such as, for example, by aligning the chip and the substrate with the spacers 26 positioned therebetween to achieve a cold weld between pairs of the respective bumps, and later applying heat to the cold welded bumps to flow the bumps into a single composition noted in FIG. 1 as the bonded terminals 16. Because in some applications indium antimonide is utilized in the composition of the substrate 18 and detector elements 12, the terminals 28 and 30 should comprise a low melting point solderable material such as indium in order that the application of heat during the bonding process will not degrade the operation of the detector array. In operation, it is intended that impinging infrared energy be directed toward the chip 10 which provides conduction of the incoming radiation within the window area boundaries 24 formed therein to the respective underlying IR detector elements 12. The entire array, however configured, may be scanned in any conventional manner across an area of interest or may be applied to an area of interest in a fixed position and treated as a mosaic detector and processing device. In either case, the relatively high density of the detector array will provide improved resolution and sensitivity of the resultant infrared image.

Thus it may be seen that there has been provided a novel high density infrared detector array which significantly improves the resolution and sensitivity of infrared image producing apparatus.

Obviously, many modifications and variations of the present invention are possible in light of the above teachings. It is therefore to be understood that within the scope of the appended claims the invention may be practiced otherwise than as specifically described.

What is claimed is:

1. A device for processing infrared radiation information, comprising, in combination:
    an array of infrared detector elements, each of said elements producing an output signal at a solderable terminal formed thereon; and
    a chip stacked upon said array and having a multiplicity of circuits formed thereon, each of said circuits having a solderable terminal formed thereon in registration with corresponding ones of said element terminals for electrically and mechanically bonding thereto and for receiving the respective output signals therefrom, said circuits being distributed suitably for the formation of a plurality of window areas, each of said window areas being transparent to infrared radiation and formed in registration with corresponding ones of said detector elements for permitting the transmission of the radiation through said chip to said array.

2. An infrared information processing device according to claim 1 further comprising at least one spacer formed to be connected between said chip and said array for maintaining a predetermined space therebetween and for rigidizing the device.

3. An infrared information processing device according to claim 2 wherein said spacer is of dielectric material.

4. An infrared information processing device according to claim 1 wherein said array forms a two dimensional mosaic configuration.

5. An infrared information processing device according to claim 4 wherein said solderable terminals are bumps.

6. An infrared information processing device accordin to claim 5 wherein said array is formed of indium antimonide.

7. An infrared information processing device according to claim 6 wherein said bumps are formed of indium.

8. An infrared information processing device according to claim 7 wherein said chip is silicon.

9. An infrared information processing device according to claim 7 wherein said chip is glass.

10. An infrared information processing device according to claim 7 wherein said chip is ceramic.

* * * * *